United States Patent
Ramachandran et al.

(10) Patent No.: US 8,149,952 B2
(45) Date of Patent: Apr. 3, 2012

(54) MULTI-MODE RECEIVER

(75) Inventors: Bala Ramachandran, Irvine, CA (US); Aravind Loke, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 861 days.

(21) Appl. No.: 10/696,626

(22) Filed: Oct. 29, 2003

(65) Prior Publication Data
US 2005/0094744 A1    May 5, 2005

(51) Int. Cl.
*H03K 9/00* (2006.01)
*H04L 25/06* (2006.01)
*H04J 3/16* (2006.01)
*H04J 3/22* (2006.01)
*H04B 7/216* (2006.01)

(52) U.S. Cl. ........ 375/316; 375/319; 375/229; 370/468; 370/441; 370/442

(58) Field of Classification Search ................ 455/552, 455/131, 76, 427; 370/441–442, 464–465, 370/468, 485–488, 543–544, 276–277, 280–282; 375/229–236, 260, 262–263, 316, 319, 340–344, 375/346, 350
See application file for complete search history.

(56) References Cited

U.S. PATENT DOCUMENTS

| | | | | |
|---|---|---|---|---|
| 6,023,615 A * | 2/2000 | Bruckert et al. | ........... | 348/14.08 |
| 6,029,052 A * | 2/2000 | Isberg et al. | ................ | 455/131 |
| 6,161,004 A * | 12/2000 | Galal et al. | ................ | 455/302 |
| 6,332,083 B1 * | 12/2001 | Shi et al. | ................ | 455/552.1 |
| 6,560,447 B2 * | 5/2003 | Rahman et al. | ........... | 455/232.1 |
| 6,694,129 B2 * | 2/2004 | Peterzell et al. | ................ | 455/76 |
| 6,816,718 B2 * | 11/2004 | Yan et al. | ................ | 455/317 |
| 6,912,381 B2 * | 6/2005 | Murtojarvi | ................ | 455/296 |
| 6,985,711 B2 * | 1/2006 | Holenstein et al. | ........... | 455/312 |
| 7,020,449 B2 * | 3/2006 | Shi | ................ | 455/234.1 |
| 7,031,748 B2 * | 4/2006 | Takagi | ................ | 455/553.1 |
| 7,215,722 B2 * | 5/2007 | Hsiao | ................ | 375/319 |
| 7,307,480 B2 * | 12/2007 | Shiu et al. | ................ | 331/44 |
| 2002/0163391 A1 | 11/2002 | Peterzell | ................ | 331/25 |
| 2002/0193108 A1 * | 12/2002 | Robinett | ................ | 455/427 |
| 2003/0072320 A1 * | 4/2003 | Seo et al. | ................ | 370/441 |
| 2003/0148749 A1 * | 8/2003 | Saito | ................ | 455/299 |
| 2003/0151443 A1 * | 8/2003 | Kondo et al. | ................ | 327/307 |
| 2004/0247046 A1 * | 12/2004 | Hsiao | ................ | 375/319 |

FOREIGN PATENT DOCUMENTS

EP    1 233 555 A1    2/2001
EP    1233555 A1 *   8/2002

OTHER PUBLICATIONS

Professor Andrea Goldsmith, EE360: Broadcast and Multiple Access Channels, Spring 2004, www.stanford.edu/class/ee360/lecture1.ppt.*
Google Definition, Broadcast.*
"IEEE 802.11a Standard", IEEE 1999, pp. 3-7.*

(Continued)

*Primary Examiner* — David C. Payne
*Assistant Examiner* — Linda Wong
(74) *Attorney, Agent, or Firm* — Forefront IP Lawgroup, PLLC (57) ABSTRACT

A multi-mode receiver system for processing signals based on a plurality of systems is disclosed. Embodiments of the invention provide for a shared architecture for processing baseband signals corresponding to a plurality of systems.

33 Claims, 5 Drawing Sheets

OTHER PUBLICATIONS

Digital Video Broadcasting, "History of the DVB Project", DVB 2003, pp. 1-6.*

Sirius, Over 100 Streams of Satellite Radio; Browse Products; pp. 1 and 2.

Nokia; Nokia 3300 Music Phone; pp. 1-3.

Written Opinion.

Robinett, Robert L. US Publication 20020193108. "Multi-Mode Satellite and Terrestrial Communication Device with Position Location". Dec. 19, 2002.

* cited by examiner

MULTI-MODE RECEIVER

BACKGROUND OF THE INVENTION

1. Field of the Invention

This invention relates generally to a transceiver. More particularly, the invention relates to a multi-mode receiver system.

2. Related Art

Feature additions in portable transceivers, such as cellular handsets, have resulted in color displays, radio receiver capabilities (e.g., for listening to music), Internet-access, among others. With the trend in cellular handsets toward miniaturization, such additional features can consume additional space and power and increase costs. Additional overhead to accommodate the above features and others typically results in a consumer choosing between a portable handset that provides additional functionality at a premium price or that requires additional attachments and/or devices that are bulky and make portability less convenient.

Therefore, it would be desirable to provide a portable transceiver that provides enhanced features without requiring significant additional overhead and/or cost.

SUMMARY OF THE INVENTION

Embodiments of the invention include a multi-mode receiver (MMR) system that uses a substantial portion of the code-division multiple access (CDMA) architecture for providing digital-broadcast satellite (DBS) system functionality. Embodiments of the invention provide a baseband section configured to process a first baseband signal based on a first system using baseband components, wherein the baseband section is further configured to process a second baseband signal based on a second system using the baseband components.

Related methods of operation are also provided. Other systems, methods, features, and advantages of the invention will be or become apparent to one with skill in the art upon examination of the following figures and detailed description. It is intended that all such additional systems, methods, and features, and advantages be included within this description, be within the scope of the invention, and be protected by the accompanying claims.

BRIEF DESCRIPTION OF THE FIGURES

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

Embodiments of a multi-mode receiver (MMR) system for a portable transceiver are disclosed. In general, the MMR system includes receiver functionality that uses much of the existing code-division multiple access (CDMA) architecture for providing functionality of a receiver designed and/or used for a digital-broadcast satellite (DBS) system (e.g., having a downlink frequency of approximately 2642.5 MHz and an approximately 25 MHz downlink bandwidth), among other systems such as global-positioning satellite (GPS) and/or personal-communication service (PCS). For example, a user may desire listening to and/or downloading stereo music between calls. The MMR system enables the download of satellite music using much of the CDMA architecture. The MMR system adapts to the different systems by using filters and DC (direct current) offset correction elements that have switchable bandwidths. Herein operating in a CDMA, DBS, GPS, or PCS "mode" will be understood to include providing receiver functionality that is consistent with a stand-alone receiver or transceiver that would be designed and/or used for that particular system or service. For example, providing receiver functionality can include providing frequency response characteristics corresponding to the particular system or service, having compliance with respective standards and protocols, etc. Thus, the MMR system achieves at least dual functionality, or in general, multi-mode functionality at minimal die size and external component cost.

Although described with particular reference to a portable transceiver that uses a CDMA architecture to provide DBS receiver functionality, the MMR system can be used with GSM (global system for mobile communications), analog AMPS (Advanced Mobile Phone system), and/or architectures compliant to other standards to provide for DBS receiver or receiver functionality for other systems. The description that follows will describe the MMR system implemented in analog baseband and digital baseband embodiments, although the MMR system is not limited to these embodiments.

Figure 1:
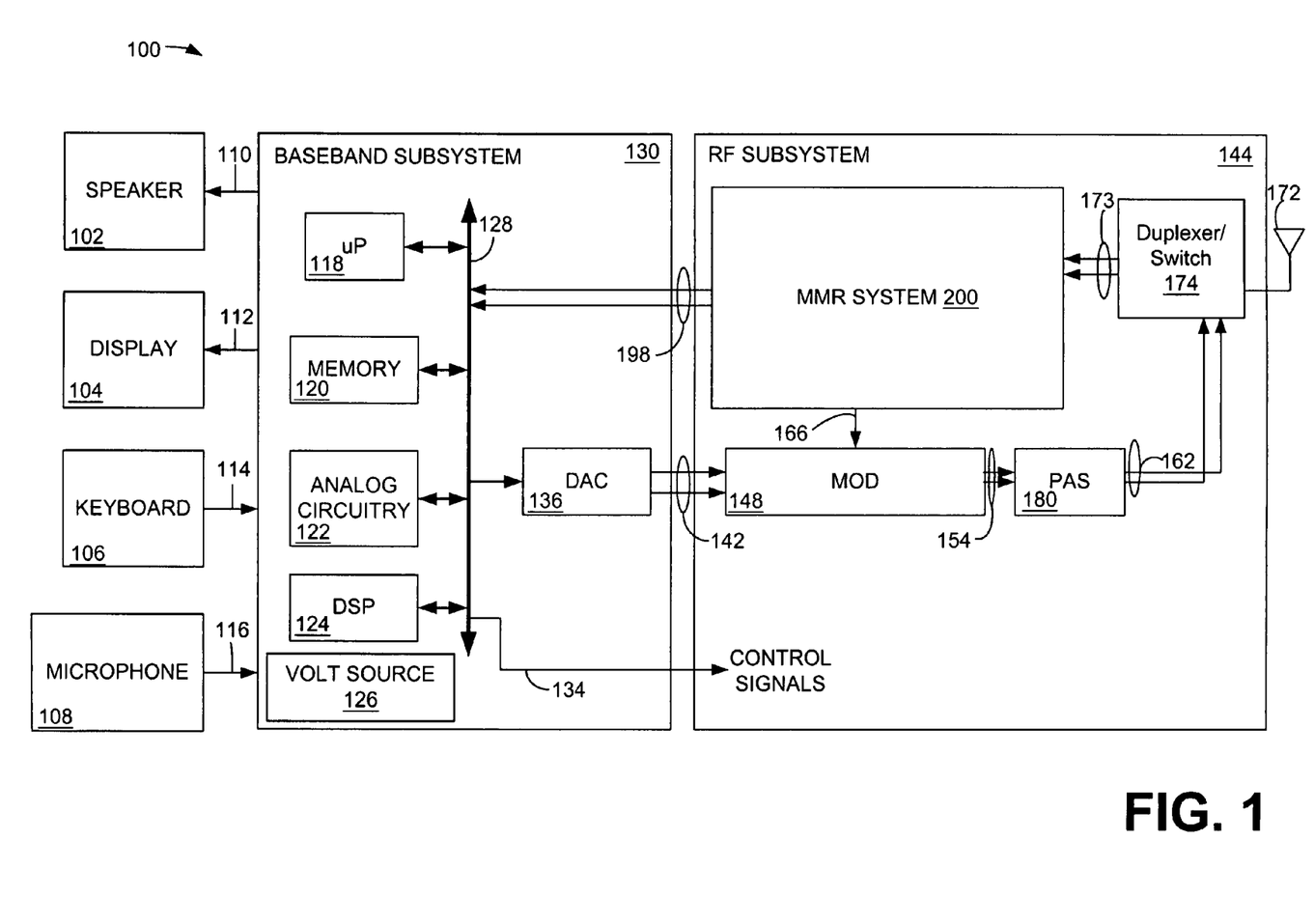
FIG. 1 is a block diagram illustrating a simplified portable transceiver with a multi-mode receiver (MMR) system.

FIG. 1 is a block diagram illustrating a simplified portable transceiver 100. The portable transceiver 100 includes a speaker 102, display 104, keyboard 106, and microphone 108, all connected to a baseband subsystem 130. In a particular embodiment, the portable transceiver 100 can be, for example but not limited to, a portable telecommunication device such as a mobile/cellular-type telephone. The speaker 102 and display 104 receive signals from the baseband subsystem 130 via connections 110 and 112, respectively, as known to those skilled in the art. Similarly, the keyboard 106 and microphone 108 supply signals to the baseband subsystem 130 via connections 114 and 116, respectively. The baseband subsystem 130 includes a microprocessor (µP) 118, memory 120, analog circuitry 122, and a digital signal processor (DSP) 124 in communication via bus 128. Bus 128, although shown as a single bus, may be implemented using multiple busses connected as necessary among the subsystems within the baseband subsystem 130. The microprocessor 118 and memory 120 provide signal timing, processing and storage functions for the portable transceiver 100. Analog circuitry 122 provides analog processing functions for the signals within the baseband subsystem 130. The baseband subsystem 130 provides control signals to a radio frequency (RF) subsystem 144 via connection 134. Although shown as a single connection 134, the control signals may originate from the DSP 124 and/or from the microprocessor 118, and are supplied to a variety of points within the RF subsystem 144. For example, the DSP 124 or microprocessor 118 can send control signals to a multi-mode receiver (MMR) system 200, enabling the MMR system 200 to switch among DBS, CDMA, PCS, and/or GPS modes. It should be noted that, for simplicity, only the basic components of the portable transceiver 100 are illustrated herein.

The baseband subsystem 130 also includes, in one embodiment, a digital-to-analog converter (DAC) 136. The DAC 136 also communicates with the microprocessor 118, memory 120, analog circuitry 122, and/or DSP 124 via bus 128. The DAC 136 converts the digital communication information within baseband subsystem 130 into an analog signal for transmission to the RF subsystem 144 via connection 142.

The analog signal on connection 142 is modulated and converted at modulator system 148, in cooperation with one or more components of the MMR system 200 (via connection 166), and provided over connection 154. A power amplifier system (PAS) 180 amplifies the modulated signal(s) on connection 154 to the appropriate power level for transmission via connection 162 to a duplexer-and-switch module 174. The transmit signal energy is provided from the duplexer-and-switch module 174 to an antenna 172.

Signals are received at the antenna 172, provided to the duplexer-and-switch module 174, and routed to one of several signal-processing paths of the MMR system 200 via connection 173. It will be appreciated by one having ordinary skill in the art that in a full-duplex transceiver, such as that used in CDMA, the simultaneous transmit/receive signal is accomplished, in one implementation, through the use of the duplexer-and-switch module 174. The duplexer-and-switch module 174 can include a duplexer to accommodate the full duplex transmission of CDMA systems as well as include a multiple output switch/filter for GPS, DBS, and/or possibly other systems and/or standards incorporated in the MMR system 200. The duplexer-and-switch module 174 will typically route one set of bands to a first port (not shown), and a second set to a second port (not shown), thus acting as a three port device (e.g., the antenna port handling all frequencies, a receive port handling receive signals for provision to the MMR system 200, and a transmit port handling transmit frequencies. In one embodiment, the operation of the duplexer-and-switch module 174 is controlled by a control signal from the baseband subsystem 130 (e.g., via connection 134). In other embodiments, a switch (e.g., controlled from the baseband subsystem 130 via connection 134, for example) can be used to route received signals to the MMR system 200 or transmit signals from connection 162 to the antenna 172.

Signals received by antenna 172 will, at the appropriate time determined by baseband system 130, be directed via the duplexer-and-switch module 174 to the MMR system 200 via connection 173. As will be described in further detail below, the MMR system 200 switches operation between the CDMA mode and the DBS mode, among other modes, using the CDMA baseband architecture for the different modes. Thus, the MMR system 200 includes components used for receiving and processing (e.g., filtering, downconversion, amplification, demodulation, etc.) signals for the various modes. The MMR system 200 provides output signals over connection 198 to the bus 128 for further processing in the digital domain.

Figure 2:
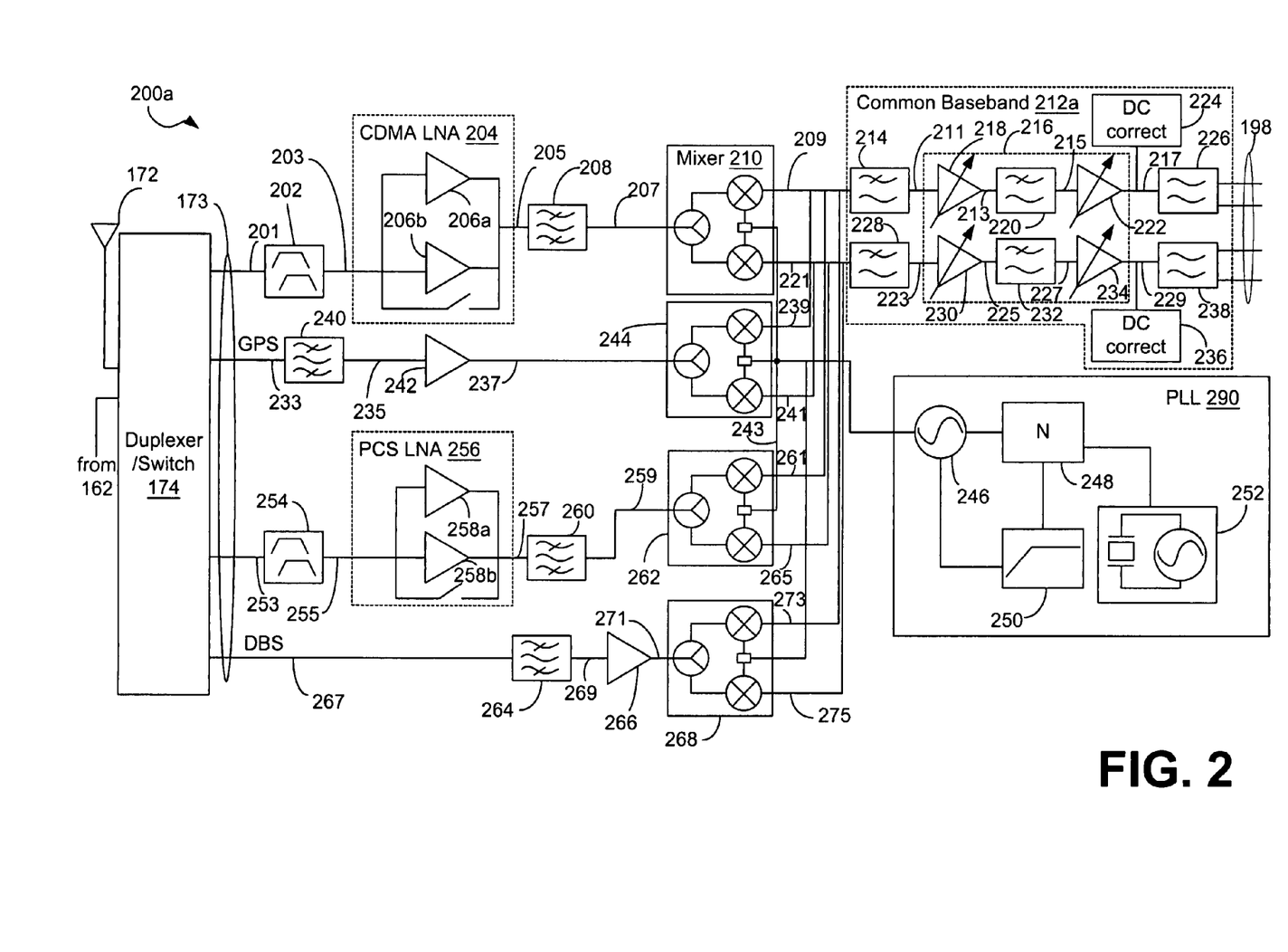
FIG. 2 is a block diagram illustrating an analog baseband embodiment of the MMR system shown in FIG. 1.

FIG. 2 is a block diagram illustrating one embodiment of an MMR system using an analog baseband system. In particular, shown is the MMR system 200a implemented with an analog baseband system. The MMR system 200a includes functionality for receiving and processing signals corresponding to several modes via connection 173. Connection 173 includes processing paths corresponding to the CDMA, GPS, PCS, and DBS modes. The path starting at connection 201 from the duplexer-and-switch module 174 corresponds to a signal-processing path for the CDMA mode. The path starting at connection 233 represents a signal-processing path corresponding to the GPS mode. The path starting at connection 253 corresponds to a signal-processing path for the PCS mode. The path starting at connection 267 corresponds to a signal-processing path for the DBS mode. A common baseband section 212a provides for a common architecture providing baseband signal-processing of signals from the various signal-processing paths.

Beginning with the CDMA signal-processing path, the signal received from the duplexer-and-switch module 174 is provided over connection 201 to a duplexer 202. The duplexer 202 filters the received signal and supplies the filtered signal on connection 203 to CDMA low noise amplifier (LNA) 204. The duplexer 202 can be a bandpass filter, which passes all channels of the particular cellular system in which the portable transceiver 100 (FIG. 1) is operating. As an example, in an 800 MHz CDMA system, the receive section of a duplexer 202 passes substantially all frequencies from approximately 869.64 MHz to 893.97 MHz, with channels spaced 30 kHz from each other. One purpose of the duplexer 202 is to reject all frequencies outside the desired frequency region. The CDMA LNA 204 amplifies the weak signal on connection 203 using amplifiers 206a and/or 206b, and provides the amplified signal over connection 205 to a CDMA Surface Acoustic Wave (SAW) filter 208. The CDMA SAW filter 208 rejects unwanted signals (e.g., transmitter signal leakage) and provides the filtered signal over connection 207 at a defined frequency to the downconverter 210 (labeled "mixer" in FIG. 2).

The downconverter 210 receives a local oscillator signal or LO, from Phase-Locked Loop (PLL) element 290. In one embodiment, the PLL element 290 includes an oscillator 246, divide-by-N 248 (where N is an integer number that is adjusted depending on the different channel numbers for the different systems), loop filter 250, and reference crystal oscillator 252. Within each standard such as CDMA or PCS, N varies depending on the channel number. For the DBS case, there is only one center frequency and hence N remains fixed. N can also be a fractional number (e.g., non-integer) depending on the system requirements corresponding to different standards. Thus, the value of N can change in a given system or mode to tune across different channels. The PLL element 290 signal instructs the downconverter 210 via connection 243 as to the proper frequency to which to downconvert the signal received from the CDMA SAW filter 208. The signal on connection 207 is thus downconverted to baseband on connection 209 (carrying the "I" signal) and 221 (carrying the "Q" signal).

The common baseband section 212a provides for filtering, DC (direct current) offset correction, and amplification of the "I" and "Q" signals of the various signal paths. The common baseband section 212a includes low-pass (LP) filters 214, 228, all-pass (AP) filters 226 and 238, DC correction elements 224 and 236, and automatic gain control (AGC) element 216. As explained below, the LP filters 214, 228 (and LP filters 220 and 232 of the AGC element 216) and DC correction elements 224 and 236 of the common baseband section 212a are adjustable (e.g., have switchable bandwidths via control signals from the baseband subsystem 130, FIG. 1) to achieve the desired frequency response for the particular mode being implemented (e.g., CDMA, PCS, GPS, DBS). For example, the 3-dB bandwidths for the CDMA, GPS, and DBS modes are approximately 630 kHz, 1 MHz, and 8 MHz, respectively. Thus, each of the LP filters 214, 228, 220, and 232 operate under a control input that changes the resistance and/or capacitance of the filter based on the desired bandwidth while minimizing the impact of filter noise. Further, the difference in DC bandwidth correction can be fifty-fold between various systems (e.g., approximately 1 kHz for CDMA versus 50 kHz for DBS), and thus the DC correction elements 224 and 236 are adjusted in a similar manner.

Since DBS systems are similar in nature to CDMA systems in terms of the physical layer signal characteristics (e.g., the waveforms in both systems are direct sequence spread spectrum systems), several of the CDMA receiver functional blocks (or rather the components therein) can be leveraged to integrate the DBS functionality with the CDMA architecture. This approach of reusing and sharing the functional blocks between CDMA and DBS provides a low-cost architecture in terms of external components, die size and total system cost. The low-pass filter cut-off frequency (LP filters 214, 228, 220, and 232) as well as the DC-offset loop corner cut-off (224 and 238) are switched between CDMA and DBS modes. The low-pass cut off frequency refers to the extent of the signal bandwidth (BW) for both modes (e.g., CDMA and DBS), for example. Since both CDMA and DBS systems are wideband systems and have negligible energy near DC, DC-offset loops can function as high-pass filters that have a high-pass cut-off frequency. In the case of CDMA, the −3 decibel (dB) cut-off of the low-pass filter is approximately 630 kiloHertz (kHz) and the high-pass corner is approximately 1 kHz. When the MMR system switches to the DBS mode, the low-pass filter cut off is switched to approximately 8.192 MHz and the high-pass corner is switched to approximately 20-50 kHz. Hence, the DC cut-off frequency can be switched between values, for example by switching capacitors or other circuit elements. The same VGAs (218 and 230) are used for the CDMA and DBS systems since the dynamic range requirements in the DBS case at the upper end is limited by the repeater distance and near field effects.

The "I" baseband signal on connection 209 corresponding to the downconverted CDMA signal is filtered by LP filter 214, and provided over connection 211 to automatic gain control (AGC) element 216. The "Q" signal on connection 221 corresponding to the downconverted CDMA signal is similarly filtered by LP filter 228, and provided over connection 223 to AGC element 216. The AGC element 216 includes variable-gain amplifiers (VGAs) 218 and 222 (in the "I" path), and 230 and 234 (in the "Q" path). The AGC element 216 also includes LP filters 220 in the "I" path and 232 on the "Q" path. The "I" and "Q" signals are amplified and low-pass filtered, and the processed "I" and "Q" signals are provided over connections 217 and 229 respectively.

The processed "I" signal on connection 217 undergoes DC correction via the DC correction element 224. The DC corrected "I" signal is subject to filtering at AP filter 226, and the filtered signal is provided over connection 198 to the baseband subsystem 130 (FIG. 1) for further signal-processing. The processed "Q" signal similarly undergoes DC correction at DC correction element 236 and filtering at AP filter 238. DC correction elements 224 and 236 are also bandwidth-adjusted based on the implemented mode, similar to that described for the LP filters of the common baseband section 212a. The filtered signal is provided over connection 198 to the baseband subsystem 130 for further signal-processing. The signal(s) on connection 198 can be provided to an analog-to-digital converter (ADC) (not shown) in the baseband subsystem 130 (FIG. 1). The ADC can provide the converted signal to other components of the baseband subsystem 130 via the bus 128 or to other components. For example, the signal can be digitized (e.g., at the ADC) and provided to the DSP 124 (FIG. 1), microprocessor 118 (FIG. 1), or a modem (not shown), etc., depending on the application.

GPS signals are received from the duplexer-and-switch module 174 on connection 233 and filtered at pre-select filter 240. The pre-select filter 240 can reject substantially all other frequencies beyond the GPS signal band. The resultant signal provided at the selected frequency is provided on connection 235 and amplified at amplifier 242. The amplified signal is provided at connection 237 to the GPS downconverter 244.

The PLL element 290 signal instructs the GPS downconverter 244 via connection 243 as to the proper frequency to which to downconvert the amplified signal on connection 237. The downconverted signals ("I" and "Q") are provided on connections 239 and 241 respectively, passed to the common baseband section 212a, and processed based on the filter settings and the DC-offset correction provided via control signals provided from the baseband subsystem 130 (e.g., via connection 134, FIG. 1). In other words, filters (e.g., 214, 228, 220, 232) and the DC correction elements 224 and 236 of the common baseband section 212a are adjusted by the baseband subsystem 130 to provide the proper frequency response for the selected mode (e.g., CDMA, GPS, etc.).

PCS signals are received at the duplexer 254 from the duplexer-and-switch module 174 over connection 253, and provided to the PCS LNA 256 via connection 255. The PCS LNA 256 includes amplifiers 258a and 258b. The selected PCS signals are provided over connection 257 to the PCS RF SAW filter 260, which selects out the desired frequency in a manner similar to that described for the CDMA SAW filter 208. The signal at the selected frequency is provided over connection 259 to the PCS downconverter 262, where it is downconverted to baseband under the control of PLL element 290 via connection 243. The baseband signals are provided over connections 261 and 265 to the common baseband section 212a for processing as described above. The LP Filters and DC correction elements are adjusted corresponding to the PCS mode, as described above.

The DBS signal-processing path includes a DBS preselect filter 264, DBS LNA 266, and DBS downconverter 268. A separate LNA 266 and downconverter 268 may be used to accommodate the different RF frequencies and no RF SAW filter is required at least in part because a direct conversion architecture is employed in one embodiment for the DBS portion of the MMR system 200a and there is no image frequency. Further, there is no transmission to the satellite and hence there is no full duplex operation like the CDMA system. The DBS signal is received at the DBS preselect filter 264 from the duplexer-and-switch module 174 over connection 267. The DBS LNA 266, as is true for the like-component shown in FIGS. 4 and 5, can include a bypass mode in order to bypass the DBS LNA 266 at high signal strengths, especially when the transceiver 100 (FIG. 1) is disposed in close proximity to a ground repeater. The filtered signal is provided over connection 269 to the DBS LNA 266. The DBS LNA 266 amplifies the signal if necessary, and the signal is then provided to the DBS downconverter 268 via connection 271. The DBS downconverter 268 receives an LO signal from the PLL element 290 over connection 243 to downconvert signals received over connections 271 to baseband. The "I" and "Q" signals provided by the DBS downconverter 268 are provided over connections 273 and 275 to the common baseband section 212a, in a manner similar to that described above for the other signal-processing paths. In other embodiments, DBS downconverter 268 can be omitted and one of the downconverters of the other systems (e.g., the PCS downconverter 262) can be used for performing downconversion of the DBS-based signal. Also as described above, the LP filters and DC correction elements are adjusted based on the selected mode.

Figure 3A:
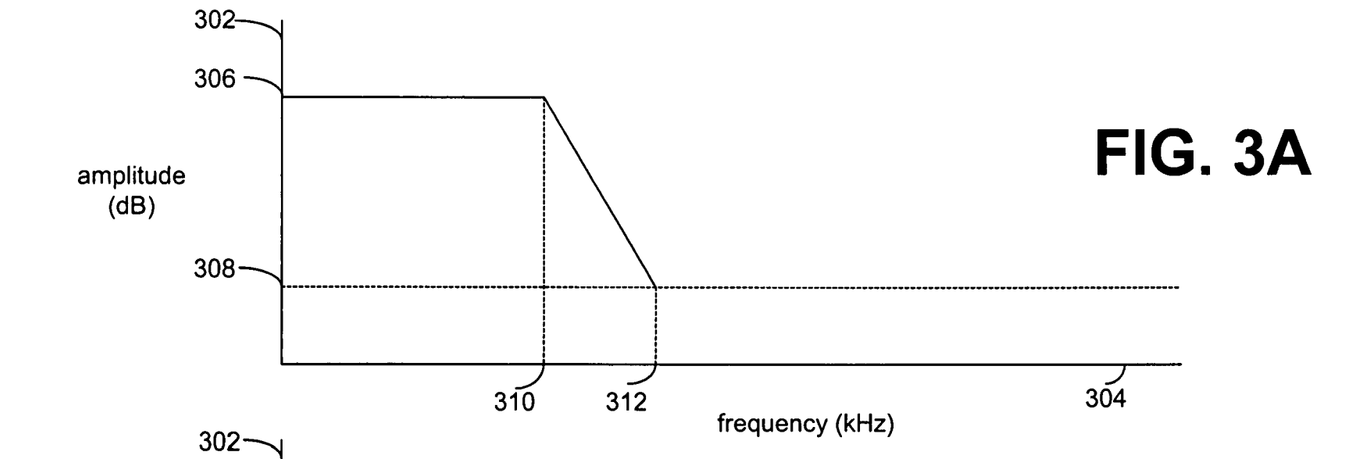
FIGS. 3A-3B are graph diagrams illustrating the different filter characteristics for the embodiment shown in FIG. 2 for code-division multiple access (CDMA) functionality and digital-broadcast satellite (DBS) functionality.
Figure 3B:
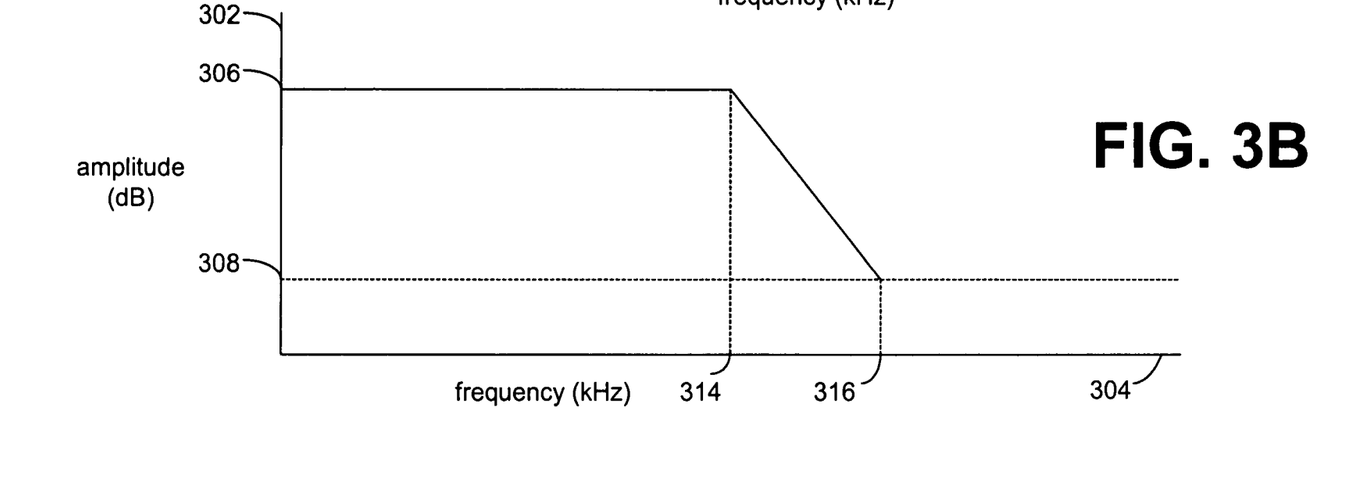

FIGS. 3A-3B are graph diagrams illustrating the different low-pass filter characteristics required for the embodiment shown in FIG. 2 for the CDMA and DBS modes. As indicated above, the LP filters 214, 220, 228, and 232 (FIG. 2) are adjusted via signals received from the baseband subsystem 130 (FIG. 1). FIG. 3A represents the LP filter characteristics for the CDMA mode, and FIG. 3B represents the filter characteristics for the DBS mode. Referring to FIGS. 3A and 3B, the y-axis 302 provides an indication of the normalized amplitude level of the processed signal in units of dB, and the x-axis 304 provides an indication of the signal frequency in units of kHz. Point 306 on the y-axis 302 represents the normalized amplitude level of the signal response, and point 308 represents that the attenuation of the filter (normalized amplitude) at a particular offset frequency is finite and does not reach infinity. Referring to FIG. 3A, the cut-off frequency (−3 dB frequency) for the CDMA mode is shown at point 310, which corresponds to approximately 630 kHz. Signals are passed up until approximately 900 kHz, as represented by point 312. For the DBS frequency response, point 314 represents the −3-dB cut-off frequency, which corresponds to 8.192 MHz. Signals are passed in the DBS mode up until approximately 11.63 MHz, as represented by point 316. Thus, when the cut-off frequency is switched from the CDMA system to the DBS system, the shift factor of the filter remains the same. The shift factor is a ratio of passband frequency to stop band frequency. For example, in a CDMA system, the passband frequency can be 630 kHz and the stop band frequency can be 900 KHz. The same or similar ratio can applied to DBS passband and stop band as well.

Figure 4:
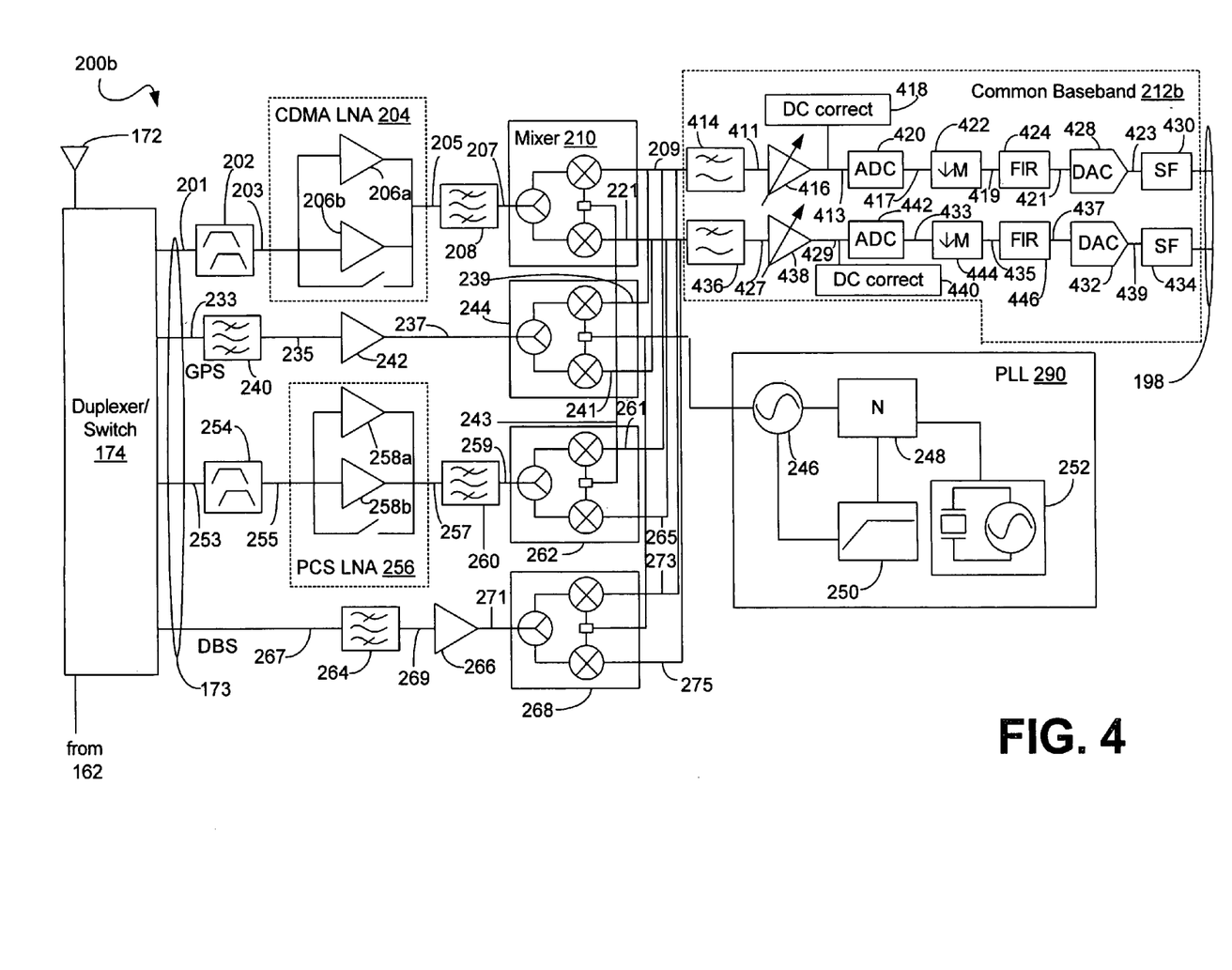
FIG. 4 is a block diagram illustrating a first digital baseband embodiment of the MMR system shown in FIG. 1.

FIG. 4 is a block diagram illustrating a second MMR system embodiment configured with a digital baseband system. The components corresponding to the signal-processing paths upstream of and including the downconverters for each signal-processing path are the same or substantially similar to that described for the MMR system 200a of FIG. 2, and thus the corresponding explanation will be omitted for clarity. "I" and "Q" baseband signals from the downconverters corresponding to the CDMA, GPS, PCS, and DBS signal-processing paths are provided to a common baseband subsection 212b. The common baseband subsection 212b includes LP filters 414 and 436, VGAs 416 and 438, DC correction elements 418 and 440, analog-to-digital converters (ADCs) 420 and 442 (e.g., sigma delta converters), and decimator filters 422 and 444 (represented by a downward arrow followed by an upper-case M). The common baseband section 212b also includes finite-impulse response filters (FIRs) 424 and 446, digital to analog converters (DACs) 428 and 432, and smoothing filters (SF) 430 and 434.

Processing of the "I" signal will be described, with the understanding that a similar explanation for processing of the "Q" signal applies. The "I" signal is filtered at the LP filter 414 and provided on connection 411. As described for the analog embodiment of FIG. 2, the LP filter 414 (and 436) and the DC-offset correction element 418 (and 440) are bandwidth adjusted (e.g., have switchable bandwidths via, for example, control signals from the baseband subsystem 130, FIG. 1) to achieve the desired frequency response for the particular mode being implemented (e.g., CDMA, PCS, GPS, DBS). The same or similar bandwidth adjustments are implemented for like-components of the embodiment illustrated in FIG. 5. The filtered signal provided on connection 411 is amplified by VGA 416 and provided on connection 413. Note that the functionality of the VGA 416 (and corresponding VGA for the "Q" signal) can be performed post-decimation (described below) in some embodiments, and/or the functionality can be integrated into the ADCs (e.g., ADC 420) in other embodiments. The amplified signal on connection 413 undergoes DC-offset correction at DC correction element 418. The DC corrected signal is provided to the ADC 420, where it is sampled corresponding to the sampling rate designated by one or more components of the baseband subsystem 130 (FIG. 1, for example, the DSP 124). The ADC 420 and 442 can thus be shared among the various modes with a change in the sampling clocks.

For example, the sampling clock of the ADC 420 is switched based on the selected mode, such that a different sample rate may be used for the CDMA mode than is used for the DBS mode. An example would be where the CDMA sampling clock is 9.6 MHz or 19.2 MHz that provides an over-sampling ratio approximately equaling 8 and 16 respectively. Alternatively, the sampling clock may be chosen to be an integer multiple of the chip rate which is 1.2288 MHz. The sampled signal is sent over connection 417 to the decimator filter 422, which downsamples from a higher frequency to a lower frequency.

Decimation is an operation of downsampling from a higher frequency to a lower frequency. It could be an integer rate conversion or a non-integer rate conversion. Decimation is then performed to a lower rate that equals either the Nyquist sampling rate or a multiple of the same. Hence, the decimation factor would equal 4 or 8 for the above-described sampling clock frequencies of 9.6 MHz and 19.2 MHz respectively. Decimation can occur to a different sampling value for the various modes (e.g., CDMA versus DBS). Thus, the decimator filter 422 (and 444) can have its sampling rate adjusted to achieve the desired decimation (e.g., via a control signal from the baseband subsystem 130, FIG. 1). In the DBS mode, the sampling clock chosen can equal a multiple of the chip rate, for example 16.384 MHz. Therefore, this would result in a sampling clock of 131.072 MHz/65.536 MHz that results in an over-sampling ratio of 8 and 4 respectively. Similar decimation factors can be employed in order to convert the output to a lower rate before feeding the digital filters.

The sampled value provided from the decimator filter 422 is provided over connection 419 to the finite-impulse response filter (FIR) filter 424. The FIR filter 424 (and 446) is also a component that is adjusted based on the mode of the signal received and processed. The filtered signal is provided over connection 421 to the DAC 428, where it is converted to an analog signal and provided over connection 423. The DAC 428 includes a sampling rate that also is adjusted based on the mode implemented. The sampling rate of the DAC 428 is generally equal to or proportional to the sampling rate implemented by the decimator filter 422. The signal provided over connection 423 is further filtered (e.g., removing alias spurs created by the sample and hold operation performed by the DAC 428) at the smoothing filter 430, and then provided over connection 198. Thus, the common baseband section 212b can process signals received in any of the modes (e.g., CDMA, GPS, PCS, or DBS) using shared components, some of which are adjusted to accommodate the various frequency responses for the respective mode.

Figure 5:
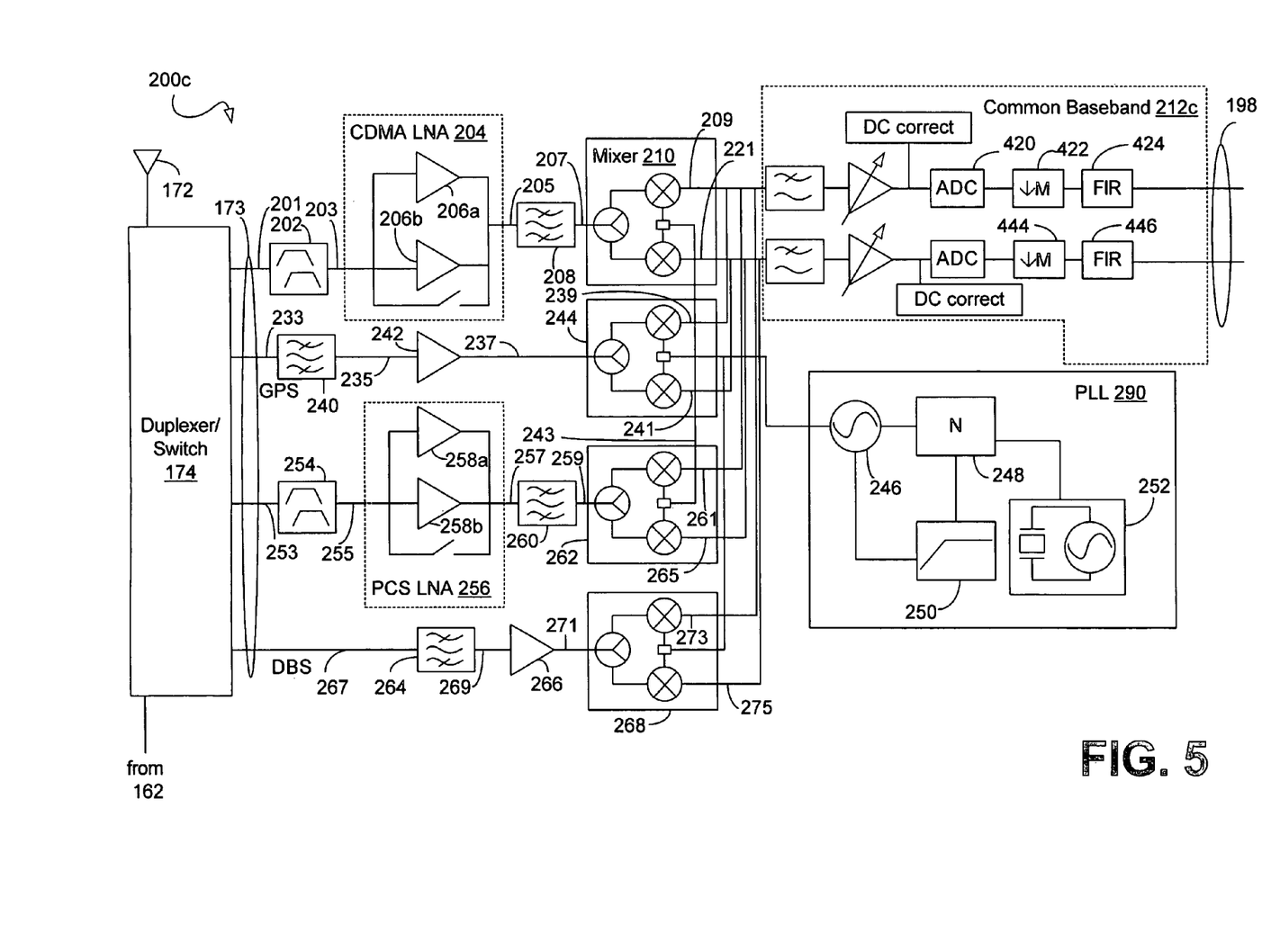
FIG. 5 is a block diagram illustrating a second digital baseband embodiment of the MMR system shown in FIG. 1.

FIG. 5 is a block diagram illustrating a third MMR system embodiment using a second digital baseband system. The third MMR system embodiment 200c shown in FIG. 5 is substantially similar to the second MMR system embodiment 200b. However, the third MMR system embodiment 200c differs from the second MMR system embodiment 200b in that the third embodiment 200c omits the DACs 428 and 432 and the smooth filters 430 and 434 of FIG. 4. Similar to the second MMR system embodiment 200b, the third MMR system embodiment 200c has a sampling rate that is switched (e.g., via ADC 420) between CDMA and DBS modes to accommodate a common architecture. Further, the decimator filters 422 and 444 and FIR filters 424 and 446 are adjusted between the two modes. Such adjustments in filter response and/or sampling rates can be implemented via read-only-memory (ROM) code in memory 120 (or microprocessor 118 or DSP 124) or dynamically adjusted (e.g., real-time processing). Also, the low-pass filters and DC-correction elements are adjusted as explained in association with FIG. 4.

The sharing of the high dynamic range ADC's between the CDMA and DBS modes, wherein the ADCs (e.g., ADCs 420 and 422, FIG. 4) are configured as sigma-delta architectures (specialized ADCs), can be designed to consume lower power when operating at the lower sampling rate, while in the DBS mode, the power may be higher. This can be handled by switching operations in additional stages to achieve the dynamic range possibly required in DBS mode.

While various embodiments of the invention have been described, it will be apparent to those of ordinary skill in the art that many more embodiments and implementations are possible that are within the scope of this invention. Accordingly, the invention is not to be restricted except in light of the following claims and their equivalents.

What is claimed is:

1. A method for receiving signals based on a plurality of systems, the method comprising:
   converting a first signal based on a first system to a first baseband signal;
   converting a second signal based on a second system to a second baseband signal;
   processing the first baseband signal using baseband components; and
   processing the second baseband signal using the baseband components, wherein processing the first baseband signal and the second baseband signal comprises selectively filtering and selectively DC-offset correcting the first and second baseband signals, wherein selectively filtering and selectively DC-offset correcting comprises selecting different filtering bandwidths and different DC-offset correcting bandwidths based on which system baseband signal is to be processed.

2. The method of claim 1, wherein the first system and the second system each include at least one of the following systems code-division multiple access, personal-communication service, global-positioning satellite, digital-broadcast satellite, and global system for mobile communications.

3. The method of claim 1, wherein the processing further includes at least one of filtering, amplifying, providing digital-to-analog conversion, providing analog-to-digital conversion, and sampling, and correcting for direct current (DC) offset.

4. The method of claim 1, wherein the processing includes processing in at least one of a digital domain and an analog domain.

5. The method of claim 1, wherein the processing includes configuring at least one of the baseband components for a first frequency response characteristic for the first baseband signal and configuring the at least one of the baseband components for a second frequency response characteristic for the second baseband signal.

6. The method of claim 5, wherein the at least one of the baseband components include at least one of low-pass filters, finite-impulse response filters, and DC-offset correction elements.

7. The method of claim 1, wherein the baseband components include at least one of low-pass filters, all-pass filters, variable-gain amplifiers, analog-to-digital converters, digital-to-analog converters, finite-impulse response filters, smoothing filters, decimator filters, and DC-offset correction elements.

8. The method of claim 1, wherein the converting and processing are performed for a plurality of signals from a plurality of systems.

9. The method of claim 1, wherein the processing includes sampling at a first sampling rate for the first baseband signal and a second sampling rate for the second baseband signal.

10. The method of claim 9, wherein the sampling is performed by at least one of a decimator filter, a digital-to-analog converter, and an analog-to-digital converter.

11. A multi-mode receiver system for processing signals based on a plurality of systems, comprising:
    a baseband section configured to process a first baseband signal based on a first system using baseband components, wherein the baseband section is further configured to process a second baseband signal based on a second system using the baseband components, wherein the baseband components comprise bandwidth-switchable low-pass filters and bandwidth-switchable DC-offset correction elements.

12. The system of claim 11, further including a downconverter that is configured to convert a first signal to the first baseband signal and a second signal to the second baseband signal.

13. The system of claim 11, further including a first downconverter and a second downconverter, the first downconverter configured to convert a first signal to the first baseband signal, the second downconverter configured to convert a second signal to the second baseband signal.

14. The system of claim 11, wherein the first system and the second system each include at least one of the following systems code-division multiple access, personal-communication service, global-positioning satellite, digital-broadcast satellite, and global system for mobile communications.

15. The system of claim 11, wherein the baseband components include at least one of the low-pass filters, all-pass filters, variable-gain amplifiers, analog-to-digital converters, digital-to-analog converters, finite-impulse response filters, smoothing filters, decimator filters, and the DC-offset correction elements.

16. The system of claim 11, wherein at least one of the baseband components are configured for a first frequency response characteristic for the first baseband signal and configured for a second frequency response characteristic for the second baseband signal.

17. The system of claim 16, wherein the at least one of the baseband components include at least one of the low-pass filters, finite-impulse response filters, and the DC-offset correction elements.

18. The system of claim 11, wherein at least one of the baseband components is configured to sample at a first sampling rate for the first baseband signal and a second sampling rate for the second baseband signal.

19. The system of claim 18, wherein the at least one of the baseband components includes at least one of a decimator filter, a digital-to-analog converter, and an analog-to-digital converter.

20. The system of claim 11, wherein the baseband section is further configured to process a plurality of signals from a plurality of systems.

21. A transceiver, comprising:
    means for transmitting signals;
    means for receiving signals, wherein the means for receiving includes pre-converting processing means;

means for converting a first signal based on a first system to a first baseband signal;
means for converting a second signal based on a second system to a second baseband signal; and
means for processing the first baseband signal, wherein the means for processing the first baseband signal is used for processing the second baseband signal, wherein the means for processing the first baseband signal comprises means for selectively filtering and means for selectively DC-offset correcting the first and second baseband signals, wherein the means for selectively filtering and the means for selectively DC-offset correcting comprises means for selecting different filtering bandwidths and means for selecting different DC-offset correcting bandwidths based on which system baseband signal is to be processed.

22. The transceiver of claim 21, wherein the first system and the second system each include at least one of the following systems code-division multiple access, personal-communication service, global-positioning satellite, digital-broadcast satellite, and global system for mobile communications.

23. The transceiver of claim 21, wherein the means for processing includes at least one of the means for filtering, means for amplifying, means for providing digital-to-analog conversion, means for providing analog-to-digital conversion, means for sampling, and the means for correcting for direct current (DC) offset.

24. The transceiver of claim 21, wherein the means for processing includes means for processing in at least one of a digital domain and an analog domain.

25. The transceiver of claim 21, wherein the means for processing includes means for providing a first frequency response characteristic for the first baseband signal and a second frequency response characteristic for the second baseband signal.

26. The transceiver of claim 21, wherein the means for processing includes means for sampling at a first sampling rate for the first baseband signal and a second sampling rate for the second baseband signal.

27. The transceiver of claim 21, wherein the means for transmitting, means for receiving, means for converting, and means for processing are performed for a plurality of signals from a plurality of systems.

28. A multi-mode receiver system, comprising:
a code-division multiple access system having a common baseband system, wherein the common baseband system includes a direct current (DC)-correction element configured to include switchable bandwidths; and
a digital-broadcast system that shares the common baseband system with the code-division multiple access system.

29. The multi-mode receiver system of claim 28, wherein the common baseband system further includes at least one of a low-pass filter, an all-pass filter, and a variable-gain amplifier.

30. The multi-mode receiver system of claim 29, wherein the low-pass filter is configured to include switchable bandwidths.

31. The multi-mode receiver system of claim 28, wherein the common baseband system further includes at least one of a low-pass filter, an analog-to-digital converter, a decimator filter, a digital-to-analog converter, a smoothing filter, a finite-impulse response filter, and a variable-gain amplifier.

32. The multi-mode receiver system of claim 31, wherein at least one of the analog-to-digital converter, the digital-to-analog converter, and the decimator filter is configured to have a first sampling rate for the code-division multiple access system and a second sampling rate for the digital-broadcast system.

33. The multi-mode receiver system of claim 31, wherein at least one of the finite-impulse response filter, the DC-correction element, and the decimator filter is configured to operate at a first frequency response for the code-division multiple access system and a second frequency response for the digital-broadcast system.

* * * * *